United States Patent [19]

Matsumoto et al.

[11] Patent Number: 5,311,362
[45] Date of Patent: May 10, 1994

[54] PROJECTION EXPOSURE APPARATUS

[75] Inventors: Koichi Matsumoto; Kazuo Ushida; Masaomi Kameyama, all of Tokyo; Hiroyuki Tsuchiya, Konosu, all of Japan

[73] Assignee: Nikon Corporation, Tokyo, Japan

[21] Appl. No.: 70,051

[22] Filed: Jun. 1, 1993

Related U.S. Application Data

[63] Continuation of Ser. No. 778,744, Oct. 18, 1991, abandoned, which is a continuation of Ser. No. 510,584, Apr. 19, 1990, abandoned.

[30] Foreign Application Priority Data

Apr. 20, 1989 [JP] Japan .................................. 1-100632

[51] Int. Cl.$^5$ .......................... G02B 9/08; G03B 27/68
[52] U.S. Cl. .................................... 359/738; 359/648; 355/52; 355/71
[58] Field of Search .................... 350/500–502, 350/442–445; 355/30, 52–53, 61, 52, 53, 68, 71; 356/401; 359/362–366, 648–663

[56] References Cited

U.S. PATENT DOCUMENTS

| | | | |
|---|---|---|---|
| 4,737,823 | 4/1988 | Bouwer et al. | 355/53 |
| 4,812,028 | 3/1989 | Matsumoto | 350/444 |
| 4,891,663 | 1/1990 | Hirose | 355/53 |
| 4,922,290 | 5/1990 | Yoshitake et al. | 355/53 |
| 4,931,830 | 6/1990 | Suwa et al. | 355/53 |
| 4,937,619 | 6/1990 | Fukuda et al. | 355/53 |
| 4,965,630 | 10/1990 | Kato et al. | 355/53 |
| 5,026,145 | 6/1991 | Harui et al. | 359/663 |

FOREIGN PATENT DOCUMENTS 61-151 6/1986 Japan .

Primary Examiner—Loha Ben
Assistant Examiner—Thong Nguyen
Attorney, Agent, or Firm—Shapiro and Shapiro

[57] ABSTRACT

A projection exposure apparatus is provided with an illumination optical system for illuminating a reticle having a predetermined pattern and a projection optical system having a predetermined numerical aperture for projecting the predetermined pattern of the reticle illuminated by the illumination optical system onto a wafer surface. The projection optical system is arranged so that, with respect to the focusing of an image of the reticle onto the wafer surface, spherical aberration, which depends on the numerical aperture of the projection optical system, shows a positive tendency corresponding to overcorrection in third-order spherical aberration and a negative tendency corresponding to undercorrection in fifth-order spherical aberration.

9 Claims, 5 Drawing Sheets

PROJECTION EXPOSURE APPARATUS

This is a continuation of application Ser. No. 778,744 filed Oct. 18, 1991, which is a continuation of application Ser. No. 510,584 filed Apr. 18, 1990, both now abandoned.

BACKGROUND OF THE INVENTION

1. Field of the Invention

The present invention relates generally to projection exposure apparatus for use in the process of manufacturing semiconductor devices and, more particularly, to a projection exposure apparatus provided with a projection optical system suitable for use in transferring micro patterns.

2. Related Background Art

Reducing projection exposure apparatus have conventionally been used in the manufacturing of semiconductor devices composed of micro patterns, such as large scale integrated circuits (LSI's) and very large scale integrated circuits (VLSI's). To handle micro patterns which will be far finer in the future, great efforts have been directed to the improvement of the accuracy and stability with which micro patterns are transferred. For example, a great number of efforts have been made at reducing the wavelength of exposing illumination light or increasing the numerical apertures (NA's) of projection optical systems. To achieve stable transference of such a micro pattern, it is also necessary to use a projection optical system having high resolution and a projecting image having high contrast. For this reason efforts have been made at finding optimum exposure conditions by variously investigating the state of illumination. For example, Japanese Utility Model Laid-Open No. 61-151 discloses a method of determined illumination conditions. In the disclosed method, a so-called σ value corresponding to the ratio of the NA of the projection optical system to the NA of an illumination optical system is selected to adjust the NA's of both optical systems, thereby providing adequate balance of resolution and contrast with respect to a predetermined pattern.

The aforesaid conventional apparatus allows the illumination optical system to be optimized to some extent but, as the NA of the projection optical system increases, depth of focus becomes shallower. As a result, when the micro pattern formed on a reticle is to be transferred onto a wafer by exposure, extremely strict focusing conditions are needed. This leads to the problem that, if even a slight amount of focus variation occurs, the micro pattern will not be transferred accurately.

In general, patterns to be transferred are not formed of simple periodic structures only and, in a major part of patterns, a plurality of micro patterns having different periodic structures coexist. In addition, general projection optical systems tend to vary their best focus positions, depending on the linewidths of individual micro patterns. Accordingly, the best focus positions differ with the finenesses of patterns to be transferred, with the result that extremely strict adjustment and control steps are indispensable to the manufacturing processes.

It is, therefore, always necessary to detect focus extremely strictly and to correct a focus position highly accurately. This leads to an increase in the complexity and size of the apparatus, an increase in the duration of process time and a deterioration in throughput.

An invention intended to cope with the above-described problems is disclosed in a commonly assigned U.S. Pat. application Ser. No. 07/451,166 filed Dec. 15, 1989 and now U.S. Pat. No. 4,965,630. In this invention, the amount of spherical aberration of a projection optical system is made excessive, whereby the resolution of an image formed on a resist having a thickness can be improved in excess of the limit of resolution which appears on the resist as a result of multiple reflection therewithin in the absence of any aberration.

However, it has been found that the prior invention still has the disadvantage that resolution deteriorates substantially if extremely fine patterns are transferred.

SUMMARY OF THE INVENTION

It is, therefore, an object of the present invention to provide a projection exposure apparatus capable of solving the above-described problems.

It is another object of the present invention to provide a projection exposure apparatus capable of extremely stably transferring a pattern with a very small linewidth onto a resist without excessively lowering the resolution of a projection optical system.

To achieve the above objects, according to the present invention, there is provided a projection exposure apparatus which is provided with an illumination optical system for illuminating a reticle having a predetermined pattern and a projection optical system having a predetermined numerical aperture for projecting the predetermined pattern of the reticle illuminated by the illumination optical system onto a wafer surface. The projection optical system is arranged so that, with respect to the focusing of an image of the reticle onto the wafer surface, spherical aberration, which depends on the numerical aperture of the projection optical system, shows a positive tendency corresponding to overcorrection in third-order spherical aberration and a negative tendency corresponding to undercorrection in fifth-order spherical aberration.

In one preferred form of the present invention, the projection optical system is arranged to satisfy the following conditions:

$$0 < \Delta S_7 < 2.5 \lambda / NA^2 \quad (1)$$

$$-0.5 \Delta S_7 < S_{10} < 1.5 \Delta S_7 \quad (2)$$

where $\lambda$ represents the wavelength of exposure light used to project the pattern of the reticle onto the wafer surface, NA represents the numerical aperture of the projection optical system, $\Delta S_{10}$ represents the amount of spherical aberration corresponding to 100% of an open aperture, and $\Delta S_7$ represents the amount of spherical aberration corresponding to 70% of the open aperture, the aforesaid spherical aberration being the vertical spherical aberration of the projection optical system, which affects the focusing of a pattern of a reticle onto a wafer surface.

With the projection exposure apparatus of the present invention, which has the above-described arrangement, it is possible to extremely stably transfer various micro patterns having distinct linewidths without excessively lowering the resolution of the projection optical system. It is, therefore, possible to decrease the number of tasks to be performed by a focus detecting device or a focus position correcting device, and it is also possible to efficiently project various micro patterns having distinct linewidths without decreasing throughput, by means of a simple arrangement.

The above and other objects, features and advantages of the present invention will be apparent from the following description of preferred embodiments of the invention with reference to the accompanying drawings.

BRIEF DESCRIPTION OF THE DRAWINGS

FIG. 2A shows the state in which no spherical aberration is present; FIG. 2B shows the state in which primarily a third-order spherical aberration occurs on the positive side; FIG. 2C shows the state in which third- and fifth-order spherical aberrations occur on the positive and negative sides, respectively;

DESCRIPTION OF THE PREFERRED EMBODIMENTS

Preferred embodiments of the present invention will be described below in detail with reference to the accompanying drawings.

Figure 1:
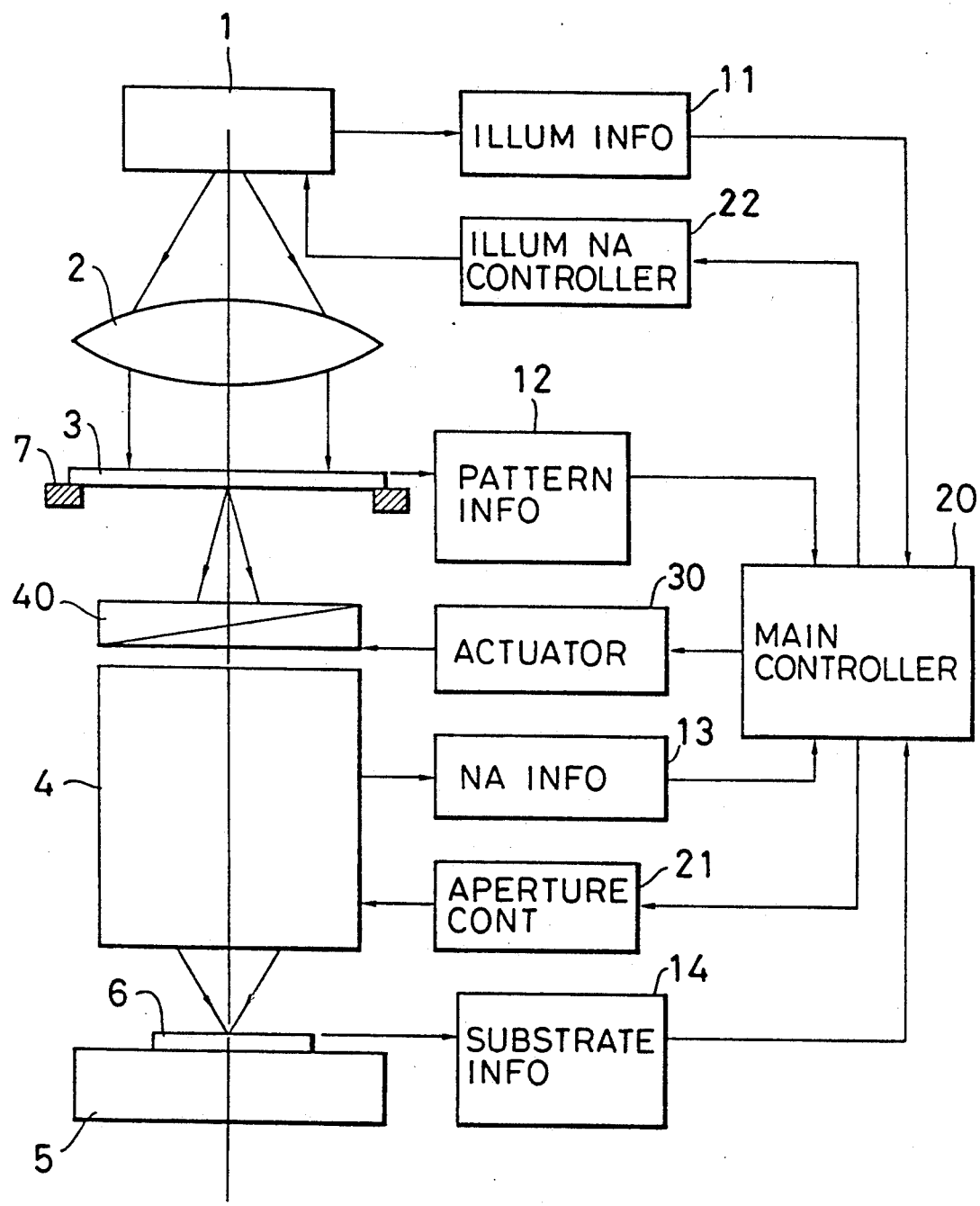
FIG. 1 is a schematic block diagram showing one embodiment of a reducing projection exposure apparatus according to the present invention.

FIG. 1 schematically shows the arrangement of a reducing projection exposure apparatus according to the present invention. As illustrated, exposing illumination light is emitted from an illuminating optical device 1 that includes an exposure light source and passes through a condenser lens 2 to uniformly illuminate a reticle 3 having a predetermined projecting pattern, which is positioned on a reticle stage 7. The projecting pattern of the reticle 3, which has been illuminated by the exposing illumination light, is projected on a reduced scale onto a wafer 6, which is positioned on a wafer stage 5, through a reducing projection objective lens assembly 4 and an optical system 40 for varying spherical aberration, both of which are part of a projection optical system and will be explained later in detail.

A detailed explanation will now be given of the spherical aberration produced when a projecting reticle pattern is focused onto a wafer surface by the reducing projection objective lens assembly 4 which constitutes an essential portion of the present invention.

To overcome the above-described problems which have been experienced with the prior art exposure apparatus, the present inventors conducted intensive research and experiments on various kinds of resists with respect to how they are illuminated under various illumination conditions. The present inventors have obtained the following findings regarding the resolution of a micro pattern which is finally formed on a wafer by photolithography. First, since multiple reflection occurs within a photosensitive object, such as a resist, having a certain degree of thickness, such resolution can only be improved to a limited extent if the focusing performance of the projection optical system is free from spherical aberration. Accordingly, if a certain amount of vertical spherical aberration is left, the resolution is rather improved. Second, there is a tendency for the best focus position to vary depending on the fineness of the reticle pattern not only in projection optical systems free of spherical aberration which have heretofore been considered, but in a projection optical system which allows third order spherical aberration to occur, such as that disclosed in the above-recited U.S. Pat. application as that of the present application. Accordingly, it has been found that both types of projection optical systems are disadvantageous in terms of the stability of the so-called overall depth of focus with respect to many kinds of reticle patterns having different finenesses. The present invention has been made on the basis of these findings.

Figure 4:
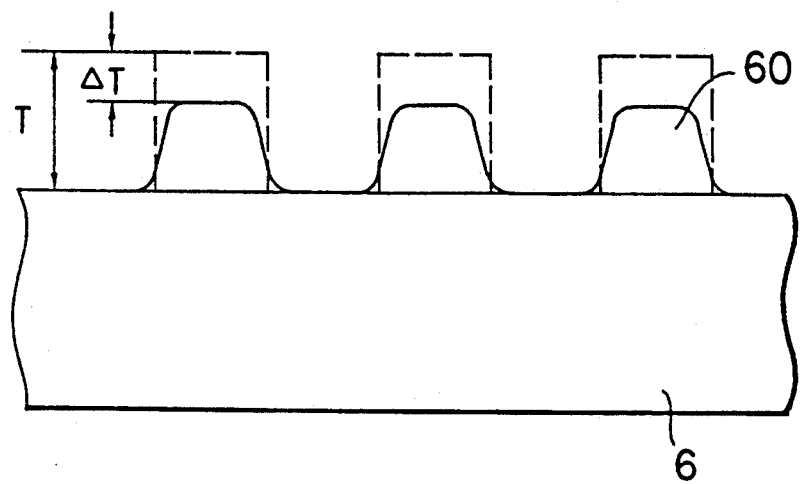
FIG. 4 is a schematic view showing the manner of "film reduction" of the resist deposited on a wafer.

It has also been found that the invention disclosed in the aforesaid prior application has the problem that resists may suffer "film reduction" when extremely fine patterns are formed by projection. Ideally, after a resist 60 (FIG. 4) applied to the wafer 6 has been exposed and developed, non-exposed regions each having a rectangular form with a predetermined thickness T should be formed as shown by dashed lines in FIG. 4 (in the case of a positive resist). However, if the phenomenon of "film reduction" occurs, the film thickness of the resist 60 is reduced by $\Delta T$. The magnitude of the "film reduction", represented by $\Delta T$, is utilized as a reference which indicates the extent of imperfection exhibited by a micro pattern formed as a resist image by exposure.

It has been found from the findings obtained from our experiment results that, if the line and space (L&S) of a desired pattern is represented by the following equation:

$$L\&S = k \cdot \lambda / NA$$

where NA is the numerical aperture of a projection optical system and $\lambda$ is the wavelength of exposure light, a satisfactory resist image can be formed from a reticle pattern having a value of k in the range of approximately 0.8–0.6, but the use of a more fine reticle pattern having a value of k= in the range of approximately 0.5–0.4 leads to the "film reduction", thus resulting in a deterioration in substantial resolution.

To solve the above problems, according to the present invention, there is provided an improvement in an projection exposure apparatus which comprises an illumination optical system for illuminating a reticle having a predetermined pattern and a projection optical system having a predetermined numerical aperture for projecting the pattern of the reticle onto a wafer surface. The improvement is based on the following finding: optimum correction for spherical aberration, which affects the focusing of a pattern image of the reticle onto the wafer surface by the projection optical system, is characterized by a positive tendency to provide overcorrection for third order spherical aberration thereof and a negative tendency to provide undercorrection for spherical fifth order aberration thereof.

Further, according to our findings, it is preferable that the amount of vertical spherical aberration of the projection optical system, which affects the focusing of a pattern image of the reticle onto the wafer surface, be determined with a range which satisfies the following conditions:

$$0 < \Delta S_7 < 2.5\lambda/NA^2 \qquad \ldots (1)$$

$$-0.5\Delta S_7 < \Delta S_{10} < 1.5\Delta S_7 \ldots \qquad (2)$$

where $\Delta S_{10}$ represents the amount of spherical aberration corresponding to 100% of an open aperture, $\Delta S_7$ represents the amount of spherical aberration corresponding to 70% of the open aperture, $\lambda$ represents the wavelength of exposure light used to project the reticle pattern onto the wafer surface and NA represents the numerical aperture of the projection optical system.

According to one preferred form of the present invention, there is provided an arrangement which is provided with spherical-aberration varying means for varying the spherical-aberration curve of the projection optical system in accordance with various factors such as illumination conditions, the finenesses of reticle patterns and the thicknesses of resists.

In general, optical images formed by projection optical systems are observed as resist images which result from multiple reflection within resists, such as photosensitive objects, having certain thicknesses. For this reason, optical images obtained from optical systems free from spherical aberration do not necessarily form the best resist images. In accordance with the present invention which will be explained in more detail below, since such a projection optical system is overcorrected for spherical aberration, it is possible to increase the substantial depth of focus without excessively deteriorating the resolution of a micro pattern.

Figures 2A, 2B, 2C:
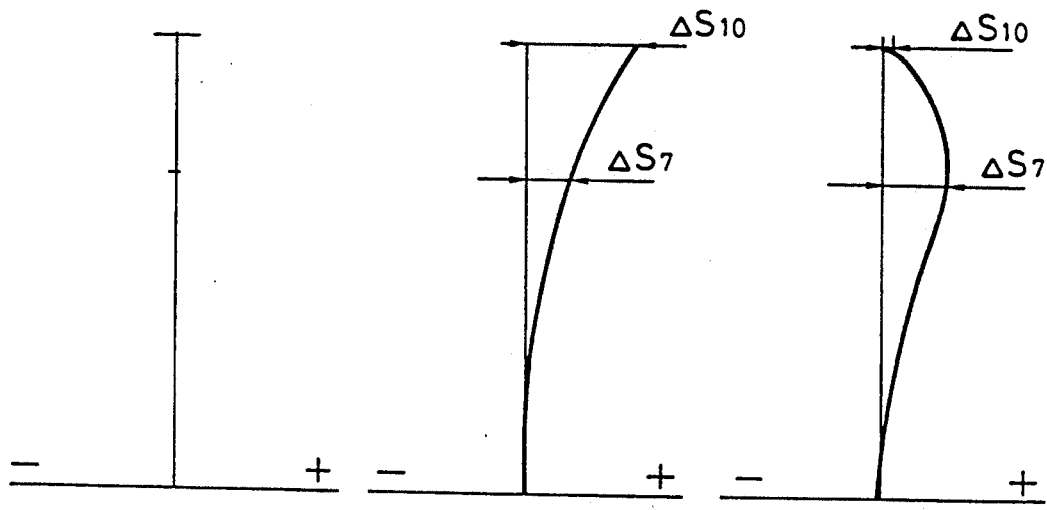
FIGS. 2A, 2B and 2C are aberration diagrams showing three kinds of correction for spherical aberration, and illustrate three manners of spherical aberration of a reducing projection objective lens assembly.

FIGS. 2A–2C and 3A–3C show the relationships between correction for spherical aberration and evaluations based on resist images. FIGS. 2A–2C show in graphic form the states of correction for spherical aberration. FIG. 2A shows a state free from spherical aberration i.e., the state in which spherical aberration is completely eliminated, FIG. 2B shows the state in which third-order spherical aberration occurs on the positive side, and FIG. 2C shows the state in which third-order spherical aberration occurs on the positive side, while fifth-order spherical aberration occurs on the negative side.

Figures 3A, 3B, 3C:
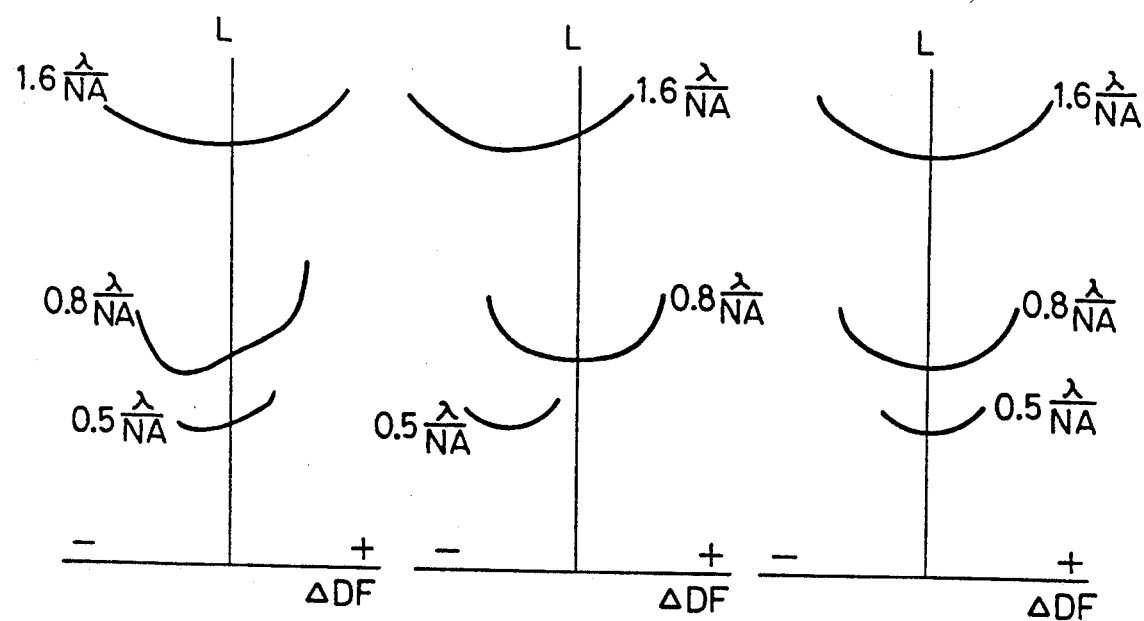
FIGS. 3A, 3B and 3C are CD-focus curve diagrams of the reducing projection objective lens which correspond to the three kinds of correction shown in FIGS. 2A, 2B and 2C.

FIGS. 3A–3C show the relationships between the displacement of focus and the linewidth of a reticle pattern transferred onto a wafer surface by exposure. In each of the drawings, the horizontal axis represents the variation of focus $\Delta DF$, while the vertical axis represents the linewidth L of the reticle pattern transferred to the wafer surface. The curves shown are generally called CD-focus curve (critical dimension-focus curve). FIGS. 3A, 3B and 3C correspond to the states of correction for spherical aberration, shown in FIGS. 2A, 2B and 2C, respectively. In each of FIGS. 3A, 3B and 3C, there are shown characteristics resulting from three patterns of different linewidths which are expressed as 1.6 $\lambda$/NA, 0.8 $\lambda$/NA and 0.5 $\lambda$/NA in terms of line and space, respectively.

The CD-focus curve diagrams of FIGS. 3A, 3B and 3C differ from general aberration diagrams such as those shown in FIGS. 2A, 2B and 2C in terms of their horizontal axes. In each of FIGS. 3A–3C, the positive (+) direction of the horizontal axis corresponds to the direction in which the back focus of the projection objective lens assembly 4 becomes shorter (the direction in which the wafer stage 5 moves upward with the wafer 6 positioned thereon as viewed in the arrangement of the embodiment shown in the in FIG. 1), while the negative (−) direciton of the horizontal axis corresponds to the direction in which the same back focus becomes longer (the direction in which the wafer stage 5 moves downward with the wafer 6 positioned thereon).

If a reticle pattern of 0.8 $\lambda$/NA or finer is used in the absence of any spherical aberration as shown in FIG. 2A, the resultant CD-focus curves will be in asymmetry, showing a tendency to rise rightward. This asymmetry serves a primary cause of a material reduction in the depth of focus which may be defined as a focus range over which the magnitude of linewidth variation is within a constant value.

If the spherical aberration is corrected in the positive direction as shown in FIG. 2B, the symmetry of the CD-focus curve corresponding to the 0.8 $\lambda$/NA line and space is improved. Accordingly, it will be understood that the value of the aforesaid depth of focus can be increased. However, there remain a number of problems. First, the best focus positions of the pattern with the 1.6 $\lambda$/NA line and space and the pattern with the 0.5 $\lambda$/NA line and space are offset from the best focus position of the pattern with the 0.8 $\lambda$/NA line and space. This phenomenon may be considered as follows: ±first order diffraction light with respect to the 0.5 $\lambda$/NA line and space and ± third order diffraction light with respect to the 1.6 $\lambda$/NA line and space pass through the portion of the spherical aberration curve which corresponds to a large aperture value, and the best focus positions of the 1.6 $\lambda$/NA and 0.5 $\lambda$/NA patterns are offset from the 0.8 $\lambda$/NA pattern. Second, since ±first order diffraction light derived from a fine pattern of, e.g., 0.5 $\lambda$/NA line and space contains a large amount of aberration, the contrast of an optical image deteriorates and the aforesaid "film reduction" occurs.

To overcome the above problems, it is desirable that the form of the spherical aberration curve be selected to have a positive tendency to provide overcorrection in a third-order region and a negative tendency to provide undercorrection in a fifth-order region, as shown in FIG. 2C. The resultant CD-focus curves are as shown in FIG. 3C; that is to say, the best focus positions of the 1.6 $\lambda$/NA and 0.5 $\lambda$/NA patterns coincide with that of the 0.8 $\lambda$/NA pattern, but the symmetry of the CD-focus curve corresponding to the 0.8 $\lambda$/NA patterns is retained.

Although not shown in FIG. 3C, it will be readily understood by those skilled in the art that the occurrence of the phenomenon of "film reduction" can be remarkably lessened even when the pattern of 0.5 $\lambda$/NA line and space is used.

The aforesaid relationship between correction for spherical aberration and CD-focus curves changes, depending on various factors such as illumination conditions, the numerical aperture of a projection optical system or the kind of wafer or resist selected as a subject to be exposed, but the above-described tendency is substantially retained. The appropriate amount of spherical aberration represented by Equations (1) and (2) was obtained by giving the above-explained consideration to the relationships between correction for spherical aberration and CD-focus curves.

If the lower limit of Equation (1) is not reached, a CD-focus curve corresponding to a pattern of the order of 0.8 $\lambda$/NA line and space is in asymmetry and steeply rises rightward. As a result, sufficient depth of focus is difficult to assure. If the upper limit of Equation (1) is exceeded, spherical aberration excessively increases and resolution itself deteriorates to a remarkable extent.

If the upper limit of Equation (2) is exceeded, the best focus positions of patterns rougher and finer than the typical 0.8 $\lambda$/NA line and space, i.e., patterns of the order of 1.6 $\lambda$/NA and 0.5 $\lambda$/NA line and space, are shifted from that of the pattern of the 0.8 $\lambda$/NA line and space in the negative direction, as represented in a CD-focus curve diagram. As a result, when various linewidths are taken into account, the overall depth of focus is substantially reduced. If the lower limit of Equation (2) is not reached, the direction of defocusing is inverted and the overall depth of focus is similarly reduced.

Referring back to FIG. 1, which shows the arrangement of a first embodiment, illumination information, such as the wavelength of exposing illumination light and the numerical aperture NA of the illumination system of the illuminating optical device 1, is supplied to a main controller 20 through an illumination information output device 11. Projecting pattern information on the linewidth of the pattern formed on the reticle 3 is supplied to the main controller 20 through a pattern information output device 12. Information on a substrate to be exposed, such as the material of a wafer, the material and thickness of a resist, is supplied to the main controller 20 through a substrate information output device 14. Information on the numerical aperture (NA) of the reducing projection objective lens assembly 4 is supplied to the main controller 20 through an information output device 13.

On the basis of the above various information, the main controller 20 calculates a spherical aberration curve having an optimum form, and controls an actuator 30 to cause a spherical aberration varying optical system 40 to generate the desired spherical aberration. Thus, an appropriate depth of focus corresponding to a particular linewidth can be selected. The spherical aberration varying optical system 40 will be explained in detail below.

The main controller 20 calculates the optimum aperture value of the reducing projection objective lens assembly 4 on the basis of the information on the fineness of the pattern of the reticle 3, which is supplied from the pattern information output device 12, and the information on illumination conditions, such as the wavelength $\lambda$ of exposing illumination light and the numerical aperture (NA) of the illuminating optical system 1, which is supplied from the illumination information output device 11. An aperture controller 21 sets the reducing projection objective lens 4 to an optimum aperture value or cooperates with an illumination NA controller 22 to set a $\sigma$ value to an optimum value. In this case, the form of the spherical aberration curve can be set to the optimum value by means of the spherical aberration varying optical system 40 on the basis of the optimum aperture value obtained not through the aperture information output device 13 but through the main controller 20.

Figure 5:
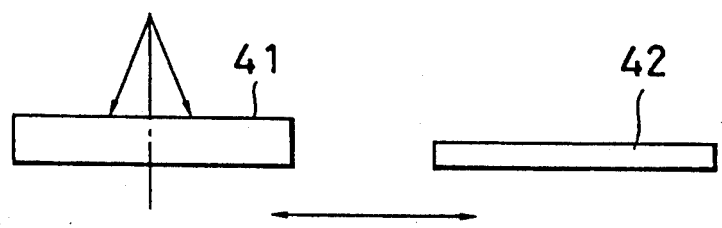
FIG. 5 is a diagrammatic view illustrating a spherical aberration varying optical system used in the embodiment of FIG. 1.
Figure 6:
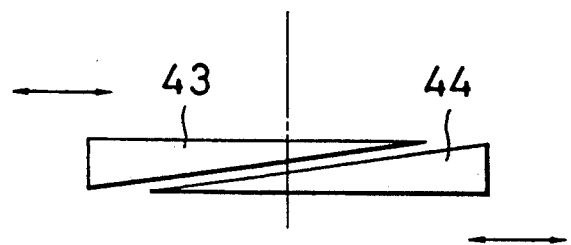
FIG. 6 is a diagrammatic view illustrating another spherical aberration varying optical system used in the embodiment of FIG. 1.
Figure 7:
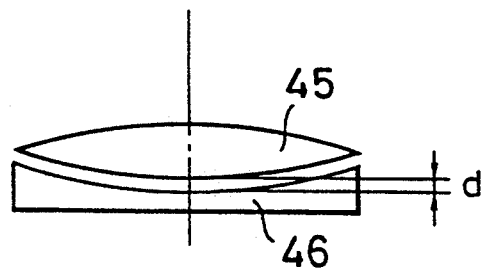
FIG. 7 is a diagrammatic view illustrating a further spherical aberration varying optical system used in the embodiment of FIG. 1.

The spherical aberration varying optical system 40, which is inserted between the reticle 3 and the reducing projection objective lens assembly 4, makes use of the phenomenon in which positive spherical aberration occurs when a spherical wave passes through a parallel flat plate. In one preferred form, a plurality of parallel flat plates 41 and 42 each having a different thickness as shown in FIG. 5 are provided as the spherical aberration varying optical system 40, and either of the plates 41 and 42 may be inserted into the optical axis as required. Alternatively, two wedge-shaped prisms 43 and 44 may be combined as shown in FIG. 6 so that the resultant center thickness is varied by moving the prisms 43 and 44 in mutually opposite directions. As shown in FIG. 7, a plurality of lenses 45 and 46 may be combined to form the spherical aberration varying optical system 40, and the spherical aberration may be altered by varying a lens space d by a small amount.

Figure 8:
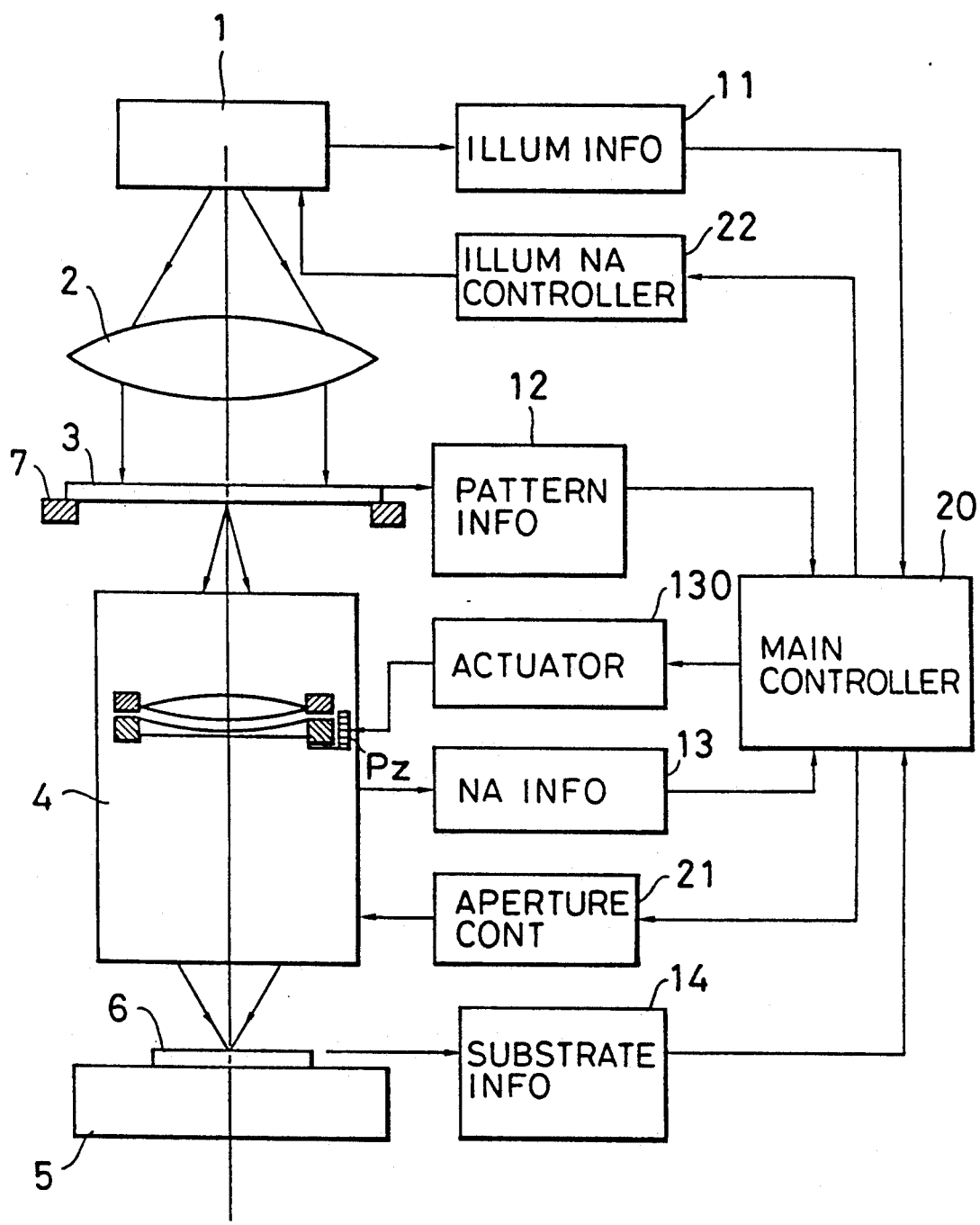
FIG. 8 is a schematic block diagram showing another embodiment of the present invention in which a reducing projection objective lens assembly is provided with a lens spacing varying device capable of varying the air spacing between lens elements which form the lens assembly, by a small amount in order to alter the state of spherical aberration.

To alter the form of the spherical aberration curve, as shown in FIG. 8 in another embodiment, the air spacing between lens elements which constitute the reducing projection objective lens assembly 4 may be directly varied by a small amount by means of a piezoelectric element or the like. As shown in FIG. 8, part of the lens elements which constitute the reducing projection objective lens assembly 4 are arranged to be displaced by a small amount along the optical axis by means of a piezoelectric element Pz. A piezoelectric actuator 130 is arranged to actuate the piezoelectric element Pz in response to a signal from the main controller 20. The arrangement and operation of the other portion are substantially the same as those of the embodiment of FIG. 1, and detailed explanation is omitted.

If any of the spherical aberration varying optical systems 40 shown in FIGS. 5 through 7 is to be disposed as in the case of the embodiment in FIG. 1, it is preferable that the reducing projection objective lens assembly 4 be telecentrically constructed also on the side adjacent to the reticle 3 and that the spherical aberration varying optical system 40 be disposed midway along the optical path between the reticle 3 and the reducing projection objective lens 4.

As is apparent from the foregoing explanation of the preferred embodiments, according to the present invention, it is possible to provide a projection exposure apparatus capable of extremely stably transferring a micro pattern without the need to increase the number of tasks to be performed by a focus detecting device or a focus position correcting device. Accordingly, it is possible to efficiently project various micro patterns having distinct linewidths without decreasing throughput.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A projection exposure apparatus comprising:
   a reticle stage;

an illumination optical system for illuminating a reticle having a predetermined pattern on said reticle stage;

a stage on which a substrate is positioned; and a projection optical system for projecting said pattern of said reticle illuminated by said illumination optical system onto said substrate;

said projection optical system being arranged to satisfy the following conditions:

$$0 < \Delta S_7 < 2.5\lambda/NA^2 \ldots \quad (1)$$

$$-0.5\Delta S_7 < \Delta S_{10} < 1.5\Delta S_7 \ldots \quad (2)$$

where NA represents the numerical aperture of said projection optical system, $\lambda$ represents the wavelength of exposure light which illuminates said reticle, $\Delta S_{10}$ represents the amount of spherical aberration corresponding to 100% of an open aperture, and $\Delta S_7$ represents the amount of spherical aberration corresponding to 70% of said open aperture, said spherical aberration being the vertical spherical aberration of said projection optical system, which affects the focusing of said pattern of said reticle onto a surface of said substrate.

2. A projection exposure apparatus according to claim 1, wherein said projection optical system includes aberration varying means for varying the amount of vertical spherical aberration which affects the focusing of said pattern of said reticle onto said surface of said substrate in the range from said amount of spherical aberration $\Delta S_{10}$ corresponding to 100% of said open aperture to said amount of spherical aberration $\Delta S_7$ corresponding to 70% of said open aperture.

3. A projection exposure apparatus according to claim 2, wherein said projection optical system is arranged in a telecentric form in which principal rays are made parallel to an optical axis on both object and image sides, said aberration varying means including a plurality of transparent parallel flat plates which have different thicknesses and which are replaceably disposed on a telecentric optical path on said object side.

4. A projection exposure apparatus according to claim 2, wherein said projection optical system is arranged in a telecentric form in which principal rays are made parallel to an optical axis on both object and image sides, said aberration varying means including two wedge-like prisms combined into a parallel flat form and disposed on a telecentric optical path on said object side, said two wedge-like prisms being relatively displaceable so as to change resultant center thickness of said flat form.

5. A projection exposure apparatus according to claim 2, wherein said projection optical system is arranged in a telecentric form in which principal rays are made parallel to an optical axis on both object and image sides, said aberration varying means including a plurality of lens elements which are inserted into an optical path between said reticle and said substrate so as to define an air spacing therebetween and means for varying said air spacing.

6. A projection exposure apparatus according to claim 2 further comprising:

means for outputting illumination information including a numerical aperture of said illumination optical system;

means for outputting pattern information on a linewidth of said pattern formed on said reticle;

means for outputting aperture-value information including a numerical aperture of said projection optical system;

means for outputting substrate information on said substrate;

means for determining an optimum spherical aberration on the basis of said illumination information, said pattern information, said aperture value information and said substrate information; and means for actuating said aberration varying means in accordance with said optimum spherical aberration determined by said determining means.

7. A projection exposure apparatus comprising:

a reticle stage;

an illumination optical system for illuminating a reticle having a predetermined pattern on said reticle stage;

a stage on which a substrate is positioned; and a projection optical system for projecting said pattern of said reticle illuminated by said illumination optical system onto said substrate, said projection optical system including lens elements which define a relatively variable air spacing to satisfy the following conditions:

$$0 < \Delta S_7 < 2.5\lambda/NA^2 \ldots \quad (1)$$

$$-0.5\Delta S_7 < \Delta S_{10} < 1.5\Delta S_7 \ldots \quad (2)$$

where NA represents the numerical aperture of said projection optical system, $\lambda$ represents the wavelength of exposure light which illuminates said reticle, $\Delta S_{10}$ represents the amount of spherical aberration corresponding to 100% of an open aperture, and $\Delta S_7$ represents the amount of spherical aberration corresponding to 70% of said open aperture, said spherical aberration being the vertical spherical aberration of said projection optical system, which affects the focusing of said pattern of said reticle onto a surface of said substrate.

8. A projection exposure apparatus according to claim 7, further comprising:

means for outputting illumination information including a numerical aperture of said illumination optical system;

means for outputting pattern information on a linewidth of said pattern formed on said reticle;

means for outputting aperture-value information including a numerical aperture of said projection optical system;

means for outputting substrate information on said substrate;

means for determining an optimum spherical aberration on the basis of said illumination information, said pattern information, said aperture value information and said substrate information; and lens actuating means for varying said air spacing in accordance with said optimum spherical aberration determined by said determining means.

9. A projection exposure apparatus according to claim 8, wherein said lens actuating means include a piezoelectric element actuating device for displacing said lens elements along the optical axis thereof by a small amount.

* * * * *